United States Patent
Marchenko et al.

(10) Patent No.: US 6,412,103 B1
(45) Date of Patent: Jun. 25, 2002

(54) ROUTING METHOD REMOVING CYCLES IN VERTICAL CONSTRAINT GRAPH

(75) Inventors: Alexander Marchenko; Andrey P. Plis, both of Moscow (RU); Vijayan Gopalakrishnan, Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/355,143

(22) PCT Filed: Jan. 23, 1997

(86) PCT No.: PCT/RU97/00007

§ 371 (c)(1),
(2), (4) Date: Jul. 22, 1999

(87) PCT Pub. No.: WO98/33132

PCT Pub. Date: Jul. 30, 1998

(51) Int. Cl.[7] .............................................. G06F 17/50
(52) U.S. Cl. .............................. 716/14; 716/13; 716/12
(58) Field of Search .............................. 716/14, 13, 12, 716/2, 7, 8–11

(56) References Cited

U.S. PATENT DOCUMENTS

| | | | | |
|---|---|---|---|---|
| 5,272,645 A | * | 12/1993 | Kawakami et al. | 716/12 |
| 5,295,082 A | * | 3/1994 | Chang et al. | 716/12 |
| 5,841,664 A | * | 11/1998 | Cai et al. | 716/14 |
| 6,086,631 A | * | 7/2000 | Chaudhary et al. | 716/16 |
| 6,099,583 A | * | 8/2000 | Nag | 716/16 |

OTHER PUBLICATIONS

Anthony D. Johnson, "On Locally Optimal Breaking of Complex Cyclic Vertical Constraints in VLSI Channel Routing," IEEE, 1996, pp. 62–95.*

Bryan Preas, "Channel Routing with Non–Terminal Doglegs," IEEE, 1990, pp. 451–458.*

Antonije D. Jovanovic, "Modeling the Vertical Constraints in VLSI Channel Routing," IEEE, 1993, pp. 11–13.*

Howard H. Chen, "Breaking Cycles and Vertical Constraints in Deutsch's New and More Different Channel–Routing Problems," IEEE, 1990, pp. 539–542.*

* cited by examiner

Primary Examiner—Vuthe Siek
(74) Attorney, Agent, or Firm—Mark J. Fink

(57) ABSTRACT

In an improved routing method vertical constraint graph is generated in which a critical node is selected. The critical node is expanded to contain corresponding terminals. The resulting subnodes within the critical node are interconnected by edges that are representative of vertical constraints. A graph coloring method is employed to split the critical node into a number of new nodes. Thereby it is possible to route channels having multi-dimensional vertical constrains.

8 Claims, 4 Drawing Sheets

US 6,412,103 B1

ROUTING METHOD REMOVING CYCLES IN VERTICAL CONSTRAINT GRAPH

FIELD OF THE INVENTION

This invention relates generally to the field of the design of electronic devices, such as printed circuits boards and semiconductor devices, and more particularly to improvements in routing of a number of nets in tracks of a channel of an electronic devices.

BACKGROUND OF THE INVENTION

Many automatic layout systems, especially VLSI circuits, apply channel routing as the basic interconnection function. However, many routers can only cope with the geometric regularity of standard cell and gate array designs. As a result these prior art automatic layout systems can not route channels with geometric generality, i.e. terminals that can have different width and irregular spacing, and simultaneously guaranteeing completion of all routes.

From Bryan Preas, "Channel Routing With Non-Terminal Doglegs", Proc. The European Design Automation Conference, Glasgow, Scotland, 1990, pp 451–458, a method for resolving cyclic vertical constrains using a generalized channel model is known. When this method is combined with a constraint based channel router, routing completion can be guaranteed for a large class of channel geometries. This method is implemented with a constrain-based, alternating-edge dogleg channel router. The method resolves cyclic constrains by adding non-terminal doglegs to enough wire segments to break all of the constraint cycles. The altered wire segments and the resulting acyclic constraint graph can be used as input to most constraint-based channel routers.

The common disadvantage of all prior art channel routers is that they can not deal with multi-layer channels having overlapping terminals because vertical constrains can not be resolved. Also, if there are terminals on more than two sides of the channel the prior art routers do not work.

It is therefore an underlying problem of the invention to provide an improved method for routing a number of nets and tracks of a channel, a method for manufacturing an electronic device and an electronic device featuring improved routing.

SUMMARY OF THE INVENTION

The problem of the invention is solved basically by applying the feature laid down in the independent claims. Further preferred embodiments are set out in the dependent claims.

The invention is advantageous in that is allows to deal with channel geometries in which individual terminals can create incoming and outgoing edges in the corresponding vertical constraint graph at the same time. This allows to use the invention for routing of multi-layer channels having overlapping terminals on different layers and also with channels having terminals on every side. The invention is also applicable for other kinds of channels because of its generality.

According to a preferred embodiment of the invention a critical node of the vertical constraint graph of the channel to be routed is split in two or more new nodes in order to resolve vertical constrains. To find the optimum number of new nodes a graph coloring method is employed. This guarantees that only a minimum of new nodes results from the splitting operation and thus a minimum number of row segments to route the same net.

Another advantage of the method of the invention is that it is adopted to be carried out automatically by means of a computer program which requires data descriptive of the channel geometry and the nets to be routed as input data. This allows it to minimize design cycle times.

An electronic device that is routed and produced according to the principles of the invention features improved compactness of design due to the improved routing. The improved routing also results in a minimized overall wiring length as well as minimized requirements for precious silicon floor space in the case of a semiconductor device.

These advantages have a beneficial impact on signal propagation delays and power dissipation. As a consequence the overall operational speed of such an electronic device is improved. For the case of a clocked electronic device the clocking frequency can be increased as compared to prior art devices.

DETAILED DESCRIPTION OF A PREFERRED EMBODIMENT

Figure 1:
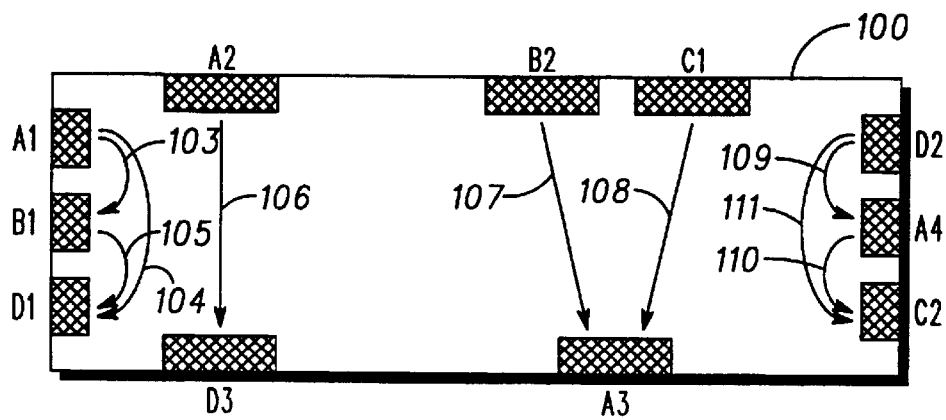
FIG. 1 shows a schematic diagram of a channel with cyclical conflicts.

FIG. 1 shows the geometry of channel 100 of an electronic device to be routed and manufactured according to the principles of the invention. Four different nets A, B, C and D are to be routed in the channel 100. In practice there can be a much larger number of nets to be routed.

The terminals A1, A2, A3 and A4 belong to the net A; the terminals B1 and B2 to the net B; the terminals C1 and C2 to the net C and the terminals D1, D2 and D3 belong to the net D. The terminals which belong to the same net have to be interconnected by routing in the channel area 102. The arrows 103 to 111 between the terminals of the nets A, B, C and D indicate the existence of vertical constrains between pairs of terminals of different nets. A vertical constraint is a constraint that exists when two different nets each have a terminal in the column of the channel 100.

For example, the terminals A1 and B1 are situated in the same leftmost column of the channel 100 that results in the vertical constraint indicated by the arrow 103. The same applies analogously for the pairs of terminals B1, D1 and A1, D1 which result in vertical constrains indicated by the arrows 105 and 104, respectively.

Moving from the left to the right in the channel area 102 the next pair of terminals which result in a vertical constraint are the terminals A2, D3. This is indicated by the arrow 106. Moving further to the right, the terminals B2, C1 and A3 are situated within the same or at least within overlapping columns of the channel 100. This results in vertical constrains between B2, A3 and C1, A3 which is indicated by the arrows 107 and 108, respectively.

In the right most column of the channel 100 the terminals D2, A4 and C2 are situated on the lateral borderline of the channel area 102. This results in vertical constrains between D2 and A4 as well as between A4 and C2 and D2, C2. These vertical constrains are indicated by the arrows 109, 110 and 111, respectively.

Figure 2:
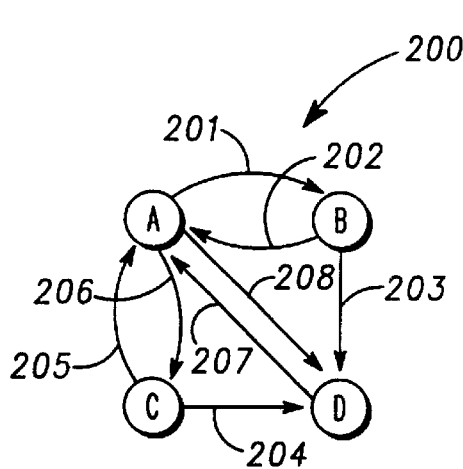
FIG. 2 shows a vertical constraint graph of the channel shown in FIG. 1.

FIG. 2 shows the resulting vertical constraint graph as a graph whose nodes represent nets and whose edges represent vertical constrains. In the example considered here there are four nets A, B, C and D each of which is represented by a corresponding node in the vertical constraint graph 200 of FIG. 2.

In the general case, a node i and a node j are interconnected by a directed edge from node i to node j if there is a vertical constraint between at least one pair of terminals of the corresponding nets i and j.

For example, the vertical constraint represented by arrow 103 in FIG. 1 results in the edge 201 between the node A and the node B of the vertical constraint graph 200. Likewise the edge 202 from node B to node A in the graph 200 results from the vertical constraint which is represented by the arrow 107 in FIG. 1. The same principles apply to all the other edges 203 to 208 of the graph 200: the edge 203 from node B to node D is representative of the vertical constraint indicated by the arrow 105 in FIG. 1; the edge 204 from node B to node C in the graph 200 is represented of the vertical constraint indicated by the arrow 111 in FIG. 1; the edge 205 from node C to node A in the graph 200 is representative of the vertical constraint indicated by the arrow 108 in FIG. 1; the edge 206 from node A to node C in the graph 200 is representative of the vertical constraint indicated by the arrow 110 in FIG. 1; the edge 207 from the node D to the node A in the graph 200 is representative of the vertical constraint indicated by the arrow 109 in FIG. 1 and the edge 208 from the node A to the node D is representative of the vertical constraint indicated by the arrows 104 and 106 in FIG. 1.

For multi-layer channels that are not considered in this preferred embodiment the same principles apply for the generation of a vertical constraint graph which models vertical constrains of the net wiring in the channel region.

Talking the vertical constrains as represented in the graph 200 as a basis the problem encountered for the routing is the removal of so called cycles. A cycle exists between two different nets if at least two of their terminals can not be connected with simple vertical segments without causing undesired short circuits. This is always the case if two nodes in the vertical constraint graph 200 are interconnected by two different edges having an opposite sense of direction. In other words: A cycle is a path from a node to itself in the vertical constrains graph.

For example, the nodes A and B are interconnected by the edges 201 and 202 in the graph 200 whereby the edges 201 and 202 have an opposite sense of direction. As a consequence there is a cycle between the nets A and B. The same applies analogously with respect to the nets A and D that are interconnected by the edges 207 and 208 as well as to the nets A and C that are interconnected by the edges 205 and 206. Each of the nodes considered in this example has cycles: (A-C-A), (A-B-A), (A-D-A), (A-D-C-A), (A-B-D-A), (A-B-D-C-A). A has 6 cycles, B has 3 cycles, C has 3 cycles and D has 4 cycles.

In order to route the channel 100 of FIG. 1 it is necessary to remove the cycles from the graph 200.

According to the teaching of the invention this is accomplished by generating an enhanced vertical constraint graph after having identified a critical node in the original vertical constraint graph 200. The critical node in a vertical constraint graph generally is defined to be the node having the maximum number of cycles.

The node A forms part of all six cycles of the graph 200 whereas the other nodes B, C and D belong to 3, 3 and 4 cycles, respectively. As a consequence the node A is the critical node of the graph 200.

In more complex graphs the situation can occur that there are two or more nodes having the same maximum number of cycles. In this case an arbitrary node of the nodes having the same maximum number of cycles is selected to be the critical node.

In the example considered here with respect to FIG. 2 the critical node A is representative of the net A to be routed. The terminals A1, A2, A3 and A4 belong to the net A. For the generation of an enhanced vertical constraint graph the terminals of the net A are represented within node A of the corresponding enhanced graph.

Figure 3:
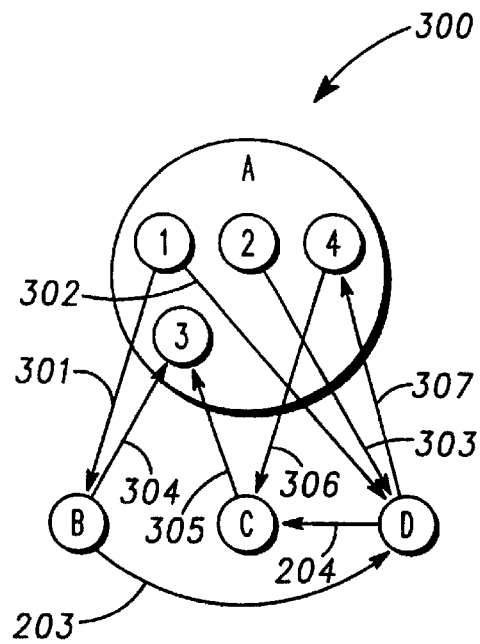
FIG. 3 is an enhanced vertical constraint graph having an expanded critical node.

This is illustrated in FIG. 3. FIG. 3 shows the enhanced vertical constraint graph 300 in which the critical node A is expanded. Still the nodes A, B, C and D in the graph 300 are representative of their corresponding nets A, B, C and D.

The expanded critical node A contains the subnodes 1, 2, 3 and 4. The subnodes 1, 2, 3 and 4 are representative of the terminals A1, A2, A3 and A4, respectively.

In other words: in order to expand the selected critical node A for each of the terminals of the net A that is represented by the critical node A a subnode is added. The edges between the subnodes of the critical node A and the other nodes B, C and D are representative of individual vertical constrains: the edge 301 from the subnode 1 to the node B is representative of the vertical constraint indicated by the arrow 103 between the terminal A1 and the terminal B1 in FIG. 1.

Likewise the edge 302 between the subnode 1 and the node D is representative of the arrow 104 in FIG. 1; the edge 303 between the subnode 2 and the node D represents the vertical constraint indicated by arrow 106 in FIG. 1; the edge 304 from node B to the subnode 3 indicates the vertical constraint of arrow 107; the edge 305 between the node 10 and the subnode 3 represents the vertical constrains of arrow 108; the edge 306 between the subnode 4 and the node C represents the vertical constraint of arrow 110 and the edge 307 between the node D and the subnode 4 represents the vertical constraint of the arrow 109.

The edges that do not connect to the critical node A in the graph 300 remain the same with respect to the original graph 200 of FIG. 2. Hence the nodes B and D are still connected by edge 203 like the edges D and C that are connected by the edge 204.

Figure 4:
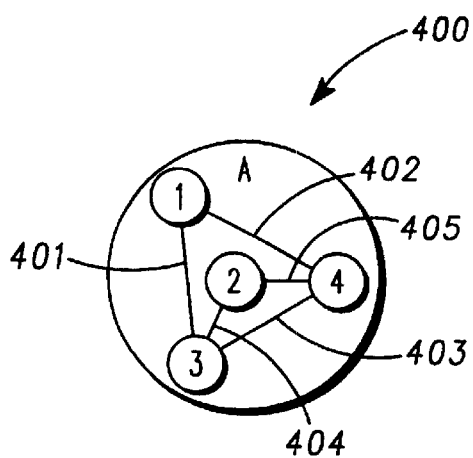
FIG. 4 is a terminal graph for the expanded critical node shown in FIG. 3.

Based on the enhanced vertical constraint graph 300 a terminal graph is generated. With respect to the example considered here FIG. 4 shows a terminal graph 400. The terminal graph 400 comprises the selected critical node A as well as the subnodes 1, 2, 3 and 4 of the critical node A.

As far as the critical node A and its subnodes are concerned there is no difference between the graph 300 and the graph 400. The edges that interconnect the subnodes in the graph 400 are extracted from the information contained in the graph 300.

Two different subnodes in the graph 400 are interconnected by an edge if there is a path between the two subnodes in the graph 300. Such a path can comprise one or more nodes which are interconnected by one or more edges. Along the path the direction of the edges has always to stay the same.

For example the subnodes 1 and 3 in the graph 400 are interconnected by edge 401. This is because there is a corresponding path between the subnodes 1 and 3 in the graph 300. Taking the subnode 1 as a starting point the elements of the path are edge 301, node B and edge 304.

Likewise the edge 402 and the graph 400 of FIG. 4 is representative of the path from subnode 1 to subnode 4. This path comprises edge 302, node D and edge 307. Analogously the edge 403 between the subnodes 3 and 4 in the graph 400 is representative of the path between the subnodes 3 and 4 the graph 300 that comprises edge 306, node C and edge 305.

The edge 404 in the graph 400 is representative of the path between the subnodes 2 and 3 in the graph 300. This path comprises edge 303, node D, edge 204, node C and edge 305. Further the edge 405 in the graph 400 is representative of the path between the subnodes 2 and 4 in the graph 300. This path comprises edge 303, node D and edge 307.

No edge exists in the graph 400 between the subnodes 1 and 2. This is because no path interconnecting the subnodes 1 and 2 in the graph 300 can be found. In order to break the cycles in the original vertical constraint graph 200 the edges in the terminal graph 400 have to be broken. This is done by splitting the subnodes into groups by dividing the selected critical node into new nodes.

Figure 5:
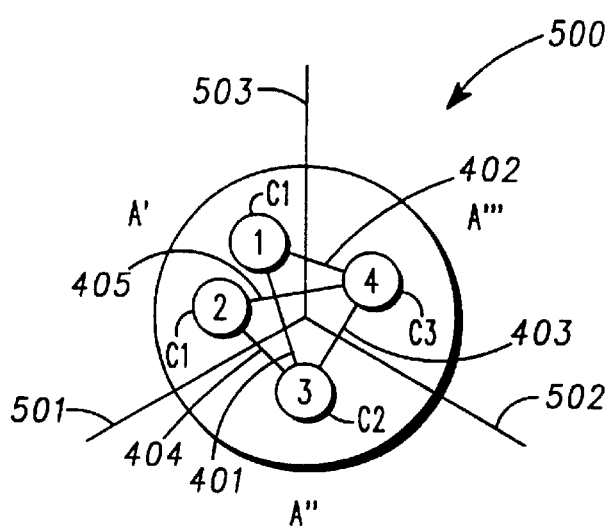
FIG. 5 is the terminal graph of FIG. 4 after application of a graph coloring method.

This is illustrated in FIG. 5. By splitting the critical node A into 3 different new nodes A', A" and A'" all of the edges 401 to 404 of the terminal graph 400 are broken as it is shown in the corresponding graph 500 of FIG. 5. In general, such subnodes in the terminal graph 400 that are not interconnected by an edge can be situated in the same group since no edge has to be broken between them. As a consequence it is not necessary to split the critical node A into four new subnodes but three new subnodes are enough to split all the edges between the four subnodes of the graph 400.

For more complex graphs it is a more difficult task to define the required groups of subnodes. According to a preferred embodiment of the invention which is considered in the following this general task is solved by applying a graph coloring method. According to such a graph coloring method the minimum number of groups of subnodes required to split all the edges in the terminal graph equals the chromatic number of the terminal graph. The chromatic number is defined as follows:

Given a positive integer p, a graph G is said to be p-chromatic if the nodes of the graph G can be painted with p distinct colors in such a way that no two nodes, which are connected by an edge in the graph G are of the same color. The smallest number p for which the graph G is p-chromatic is called the chromatic number of the graph G.

Methods for coloring a graph in order to find the chromatic number are known from the prior art, for example from Claude Berge, "Theorie Des Graphes Et Ses Appliaction", Dunod, Paris, 1958 as well as from "J. A. Bondy, U. S. R. Murty, "Graph Theory with Applications", Elsevier North Holland, New York, 1980, Chapter 8 (Vertex Colourings), page 133 and N. Christofides, "An Algorithm for the chromatic number of a graph", The Computer Journal, Vol. 14, page 38–39".

If such a graph coloring method is applied to the graph 500 in order to find the chromatic number p, this results in the three different colors C1, C2 and C3. The subnodes 1 and 2 have the same color C1 whereas the subnodes 3 and 4 have different colors C2 and C3, respectively. This result is correct since only the subnodes 1 and 2 are not interconnected by an edge so that they can have the same color.

As a result of the graph coloring method the chromatic number p is found which in this case equals 3. Nodes having the same color constitute one separate group. The corresponding splitting operation of the critical node into three new nodes is symbolized by the lines 501, 502 and 503 that intersect all the edges 401 to 405. Thereby all of the edges in the terminal graph are removed. The resulting transformed vertical constraint graphs is shown in FIG. 6.

Figure 6:
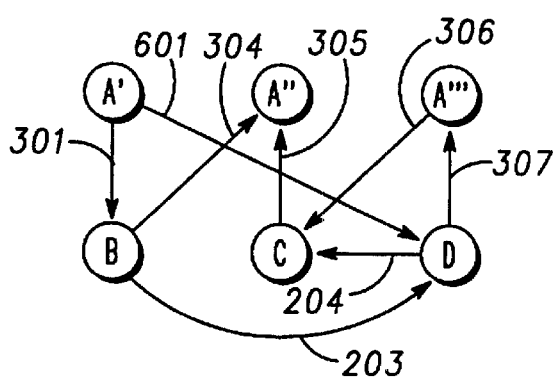
FIG. 6 is a transformed vertical constraint graph after node splitting.

As compared to the original vertical constraint graph 200 of FIG. 2 the transformed vertical constraint graph 600 of FIG. 6 has the new nodes A', A" and A'" which replace the selected critical node A. The node A' in FIG. 6 is representative of the group of subnodes having the color C1 which are the subnodes 1 and 2, the new node A" represents the subnode 3 in the graph 500 which has the color C2 and the new node A'" represents the subnode 4 which has the color C3.

The graph 600 shown in FIG. 6 is a result of the splitting operation of the critical node A carried out in the enhanced vertical constraint graph 300 of FIG. 3. If the critical node A is split into the new nodes A', A" and A'" which are representative of the subnodes 1, 2 and 3 and 4, respectively this means that the edges 304 and 305 which connect to the subnode 3 have to be connected to the new node A" and that the edges 306 and 307 that connect to the subnode 4 in FIG. 3 have to be connected to the new node A'" in FIG. 6 correspondingly. Also the edge 301 that is connected to the subnode 1 as to connect the new node A' in the transformed graph 600 correspondingly. With respect to the graph 300 both edges 302 and 303 connect the subnodes 1 and 2 which belong to the same group to the node D. These two edges are represented by one single edge 601 in the transformed graph 600. The edges 203 and 204 in the new graph 600 remain the same with respect to the graph 300.

No more cycles are present in the vertical constraint graph after its transformation from graph 200 to graph 600.

In other examples of application of the invention there can still be cycles. In such a case the same transformation is carried out taking the transformed vertical constraint graph as the starting point for the next transformation until all cycles are resolved.

This means that if in the graph 600 cycles were present again a new critical node would have to be selected and the same transformation that has been carried out with respect to the graph 200 would apply to the transformation of the graph 600. This procedure is repeated until all cycles are resolved.

Once all cycles are resolved the resulting vertical constraint graph can be used to assign tracks in the channel to route the nets. Each node in the transformed vertical constraint graph corresponds to one horizontal wiring segment that interconnects the terminals of which it is representative. Each edge in the resulting vertical constraint graph means that the horizontal segment of the antecedent of the edge has to be placed higher than the segment of its descendent in the channel. Thus the vertical constraint graph defines the order of horizontal segments to be assigned to the tracks of the channel.

Figure 7:
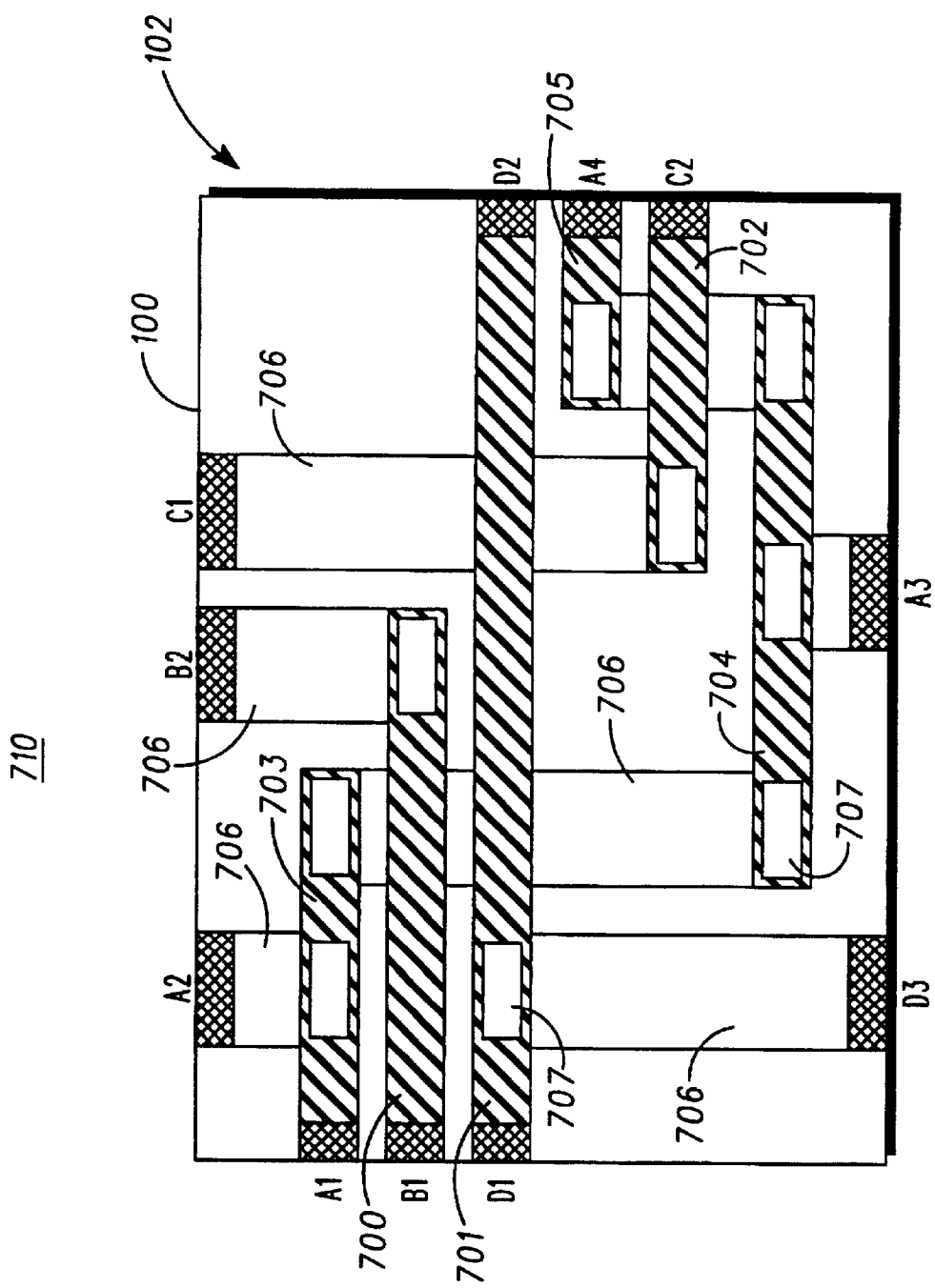
FIG. 7 shows the resulting electronic device with its channel routing.

With respect to the example considered here, the result of the routing based on the graph 600 of FIG. 6 is shown in FIG. 7. The segment 700 in the channel area 102 that interconnects the terminals B1 and B2 corresponds to the node B of FIG. 6. The segment 701 that interconnects the terminals D1, D2 and D3 belongs to the node D of FIG. 6 well as the segment 702 that interconnects the terminals C1 and C2 correspond to the node C in FIG. 6. Likewise the segment 703 that interconnects the terminals A1 and A2 and the segment 704 that interconnects only the terminal A3 and the segment 705 that only interconnects the terminal A4 correspond to the nodes A', A" and A''', respectively in FIG. 6. Also the horizontal position of the horizontal segments in the channel area 102 is determined by the edges in the graph 600 of FIG. 6. For example the segment 700 has to be placed below the segment 703 because of the edge 301 which puts segment 700 belonging to the node B in an inferior position with respect to the segment 703 belonging to the node A'.

After the placement of the horizontal segments 700 to 705 in the channel area 102 according to the information contained in the graph 600 of FIG. 6, the respective interconnections are completed by adding the vertical wiring segments 706 that interconnect the horizontal segments by means of wires 707. After the routing is completed a corresponding electronic device 710 is fabricated. The routing can be implemented by any known technique such as a photo-lithographic process and/or etching processes.

Figure 8:
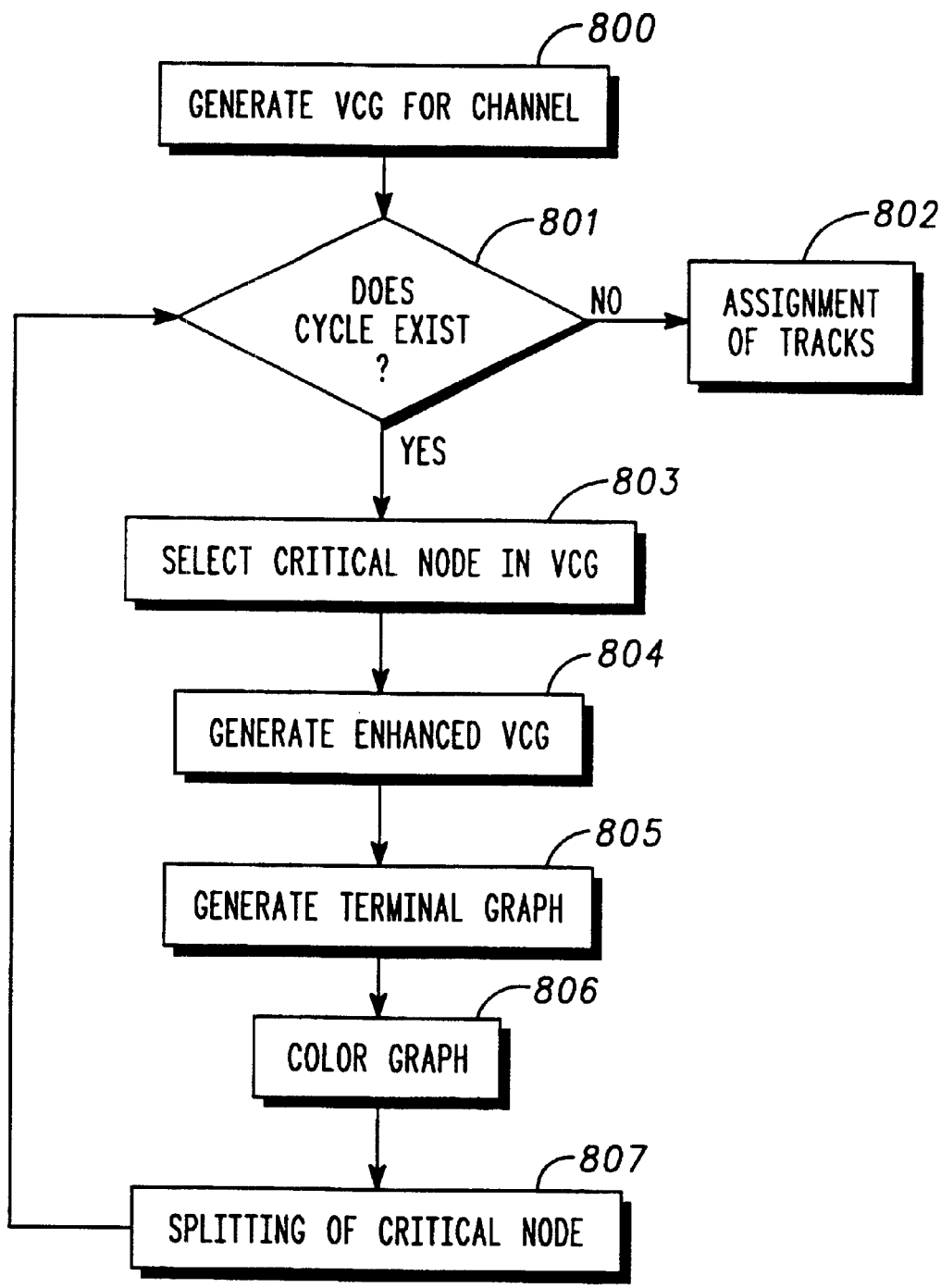
FIG. 8 shows a flow diagram of one embodiment of the invention.

FIG. 8 shows a flow chart of an embodiment of the method of the invention. In the first step 800 of the procedure a vertical constraint graph (VCG) is generated for the channel to be routed. The generation of such a graph has been explained with respect to FIG. 1 and FIG. 2 for this specific example. In the general case the same principles apply.

In step 801 it is decided whether a cycle exists in the vertical constraint graph found in step 800. If this is not the case no need for cycle removal exists and the vertical constraint graph can be taken as a basis for track assignment in step 802 as explained with reference to FIGS. 6 and 7.

If there are cycles in the vertical constraint graph generated in step 800 the control goes to step 803 in which the critical node in the vertical constraint graph is selected. This has been explained in more detail with respect to the example shown in FIGS. 2 and 3. Consecutively an enhanced vertical constraint graph is generated in step 804 according to the principles as explained with respect to FIG. 3.

In step 805 a terminal graph is generated like the graph 400 in FIG. 4 and the terminal graph is colored in step 806 according to a suitable graph coloring method. In step 807 the selected critical node is split and the control returns to step 801. There it is decided again whether still a cycle exists. If this is no longer the case the transformed vertical constraint graph is used for assigning the tracks in the channel in step 802; if there are still cycles the same sequence of steps 803 to 807 is carried out again until all cycles are removed.

A particular advantage of the routing method of the invention is that it can readily be implemented by means of a computer program and carried out automatically without human interaction. The only input parameters required for the computer program is the channel geometry and the nets to be wired. Such a computer program may be stored on any program storage device, such as a hard disc, a tape or a CD ROM.

What is claimed is:

1. A method for routing a number of nets (A, B, C, D) in tracks of a channel (100) of an electronic device for the interconnection of terminals (A1–A4; B1–B2; C1–C2; D1–D3) of said nets, said method comprising the steps of
   a) generating a vertical constraints graph (200) for said channel;
   b) selecting a critical node (A) of said vertical constraints graph being a node having a maximum number of cycles;
   c) generating an enhanced vertical constraints graph (300) by expanding said critical node to contain a subnode (1–4) for each said terminal (A1–A4) belonging to said net (A) which said critical node (A) represents;
   d) generating a terminal graph (400) comprising said subnodes, a first and a second one of said subnodes being connected by an edge (401–405) in said terminal graph if there is a path between said first subnode and said second subnode in said enhanced vertical constraints graph;
   e) splitting said critical node into new nodes (A', A", A''') to break all of said edges (401–405) in said terminal graph to thereby produce a transformed vertical constraints graph (600) wherein the split critical node has no more cycles;
   f) repeating steps b) to e) until all cycles in said transformed vertical constraints graph are removed;
   g) assigning of said tracks according to said transformed vertical constraints graph.

2. The method of claim 1 said step e) of splitting said critical node comprising the steps of
   e1) processing of said terminal graph according to a graph coloring method;
   e2) grouping all of said subnodes having the same color into the same one of said new nodes.

3. A method for manufacturing an electronic device having a channel (100), said channel having wiring to implement a routing of a number of nets (A, B, C, D) in tracks of said channel, said method comprising the steps of;
   a) manufacturing said wiring in said channel, said wiring being routed in accordance with the steps of;
   b) generating a vertical constraints graph (200) for said channel;
   c) selecting a critical node (A) of said vertical constraints graph being a node having a maximum numbers of cycles;
   d) generating an enhanced vertical constraints graph (300) by expanding said critical node to contain a subnode (1–4) for each said terminal (A1–A4) belonging to said net (A) which said critical node (A) represents;
   e) generating a terminal graph (400) comprising said subnodes, a first and a second one of said subnodes being connected by an edge (401–405) in said terminal graph if there is a path between said first subnode and said second subnode in said enhanced vertical constraints graph;
   f) splitting said critical node into new nodes (A', A", A''') to break all of said edges (401–405) in said terminal graph to thereby produce a transformed vertical constraints graph (600) wherein the split critical node has no more cycles;
   g) repeating steps b) to e) until all cycles in said transformed vertical constraints graph are removed;
   h) assigning of said tracks according to said transformed vertical constraints graph.

4. The method for manufacturing an electronic device according to claim 3, said step f) of splitting said critical node comprising the steps of
   f1) processing of said terminal graph according to a graph coloring method;
   f2) grouping all of said subnodes having the same color into the same one of said new nodes.

5. A program storage device embodying a program executable by a computer to perform a method for routing a number of nets (A, B, C, D) in tracks of a channel (100) of an electronic device for the interconnection of terminals (A1–A4; B1–B2; C1–C2; D1–D3) of said nets, said method comprising the steps of a) generating a vertical constraints graph (200) for said channel;

b) selecting a critical node (A) of said vertical constraints graph being a node having a maximum numbers of cycles;

c) generating an enhanced vertical constraints graph (300) by expanding said critical node to contain a subnode (1–4) for each said terminal (A1–A4) belonging to said net (A) which said critical node (A) represents;

d) generating a terminal graph (400) comprising said subnodes, a first and a second one of said subnodes being connected by an edge (401–405) in said terminal graph if there is a path between said first subnode and said second subnode in said enhanced vertical constraints graph;

e) splitting said critical node into new nodes (A', A'', A''') to break all of said edges (401–405) in said terminal graph to thereby produce a transformed vertical constraints graph (600) wherein the split critical node has no more cycles;

f) repeating steps b) to e) until all cycles in said transformed vertical constraints graph are removed;

g) assigning of said tracks according to said transformed vertical constraints graph.

6. The program storage device according to claim 5, said step e) of splitting said critical node comprising the steps of f1) processing of said terminal graph according to a graph coloring method;

f2) grouping all of said subnodes having the same color into the same one of said new nodes.

7. An electronic device having implemented therein a channel (100) with of a number of nets (A, B, C, D) being routed in tracks of said channel for the interconnection of terminals (A1–A4; B1–B2; C1–C2; D1–D3) of said nets, said routed tracks being designed in accordance with the steps of a) generating a vertical constraints graph (200) for said channel;

b) selecting a critical node (A) of said vertical constraints graph being a node having a maximum numbers of cycles;

c) generating an enhanced vertical constraints graph (300) by expanding said critical node to contain a subnode (1–4) for each said terminal (A1–A4) belonging to said net (A) which said critical node (A) represents;

d) generating a terminal graph (400) comprising said subnodes, a first and a second one of said subnodes being connected by an edge (401–405) in said terminal graph if there is a path between said first subnode and said second subnode in said enhanced vertical constraints graph;

e) splitting said critical node into new nodes (A', A'', A''') to break all of said edges (401–405) in said terminal graph to thereby produce a transformed vertical constraints graph (600) wherein the split critical node has no more cycles;

f) repeating steps b) to e) until all cycles in said transformed vertical constraints graph are removed;

g) assigning of said tracks according to said transformed vertical constraints graph.

8. The electronic device according to claim 7, said step e) of splitting said critical node comprising the steps of e1) processing of said terminal graph according to a graph coloring method;

e2) grouping all of said subnodes having the same color into the same one of said new nodes.

\* \* \* \* \*